US012689358B2

(12) United States Patent
Mehdizad Taleie et al.

(10) Patent No.: US 12,689,358 B2
(45) Date of Patent: Jul. 21, 2026

(54) CLOCK SPUR REDUCTION VIA PHASE-CONTROLLED REPLICA PATH

(71) Applicant: QUALCOMM Incorporated, San Diego, CA (US)

(72) Inventors: Shahin Mehdizad Taleie, San Diego, CA (US); Dongwon Seo, San Diego, CA (US); Bhushan Shanti Asuri, San Diego, CA (US); Ibrahim Ramez Chamas, Carlsbad, CA (US); Huan Wang, Irvine, CA (US); Zhiheng Wang, San Diego, CA (US); Reza Rodd, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 217 days.

(21) Appl. No.: 18/449,552

(22) Filed: Aug. 14, 2023

(65) Prior Publication Data

US 2025/0062754 A1     Feb. 20, 2025

(51) Int. Cl.
    *H03K 5/01*      (2006.01)
    *H03K 19/20*     (2006.01)
    *H03K 5/00*      (2006.01)

(52) U.S. Cl.
    CPC .............. *H03K 5/01* (2013.01); *H03K 19/20* (2013.01); *H03K 2005/00019* (2013.01)

(58) Field of Classification Search
    CPC ..................... H03K 5/01; H03K 19/20; H03K 2005/00019; H03K 19/00346
    USPC ......................................... 327/261
    See application file for complete search history.

(56) References Cited

U.S. PATENT DOCUMENTS

| | | | |
|---|---|---|---|
| 5,399,996 A | | 3/1995 | Yates et al. |
| 6,091,165 A | * | 7/2000 | Askew ............. H03K 19/00346 |
| | | | 307/409 |
| 7,759,998 B2 | * | 7/2010 | Ishikawa ................... H03L 7/07 |
| | | | 327/261 |
| 8,368,428 B2 | | 2/2013 | Tran Vo et al. |
| 8,558,580 B1 | | 10/2013 | Cheng et al. |
| 9,397,646 B2 | * | 7/2016 | Singh ................... G11C 29/023 |

(Continued)

FOREIGN PATENT DOCUMENTS

| | | |
|---|---|---|
| EP | 2202899 A1 | 6/2010 |
| JP | S63296261 A | 12/1988 |

OTHER PUBLICATIONS

International Search Report and Written Opinion—PCT/US2024/042176—ISA/EPO—Mar. 28, 2025.

(Continued)

*Primary Examiner* — Ryan Jager
(74) *Attorney, Agent, or Firm* — Gerald P. Joyce, III

(57)     ABSTRACT

Certain aspects of the present disclosure provide apparatus and techniques to generate signals for clock spur attenuation. An example apparatus generally includes: one or more circuits coupled between a voltage rail and a reference potential node, wherein the one or more circuits are configured to operate using a clock signal; a delay signal generator configured to receive the clock signal and apply a delay to the clock signal to generate a delay signal; and signal generation circuitry coupled between the voltage rail and the reference potential node and configured to generate a signal fluctuation on at least one of the voltage rail or the reference potential node based on the delay signal.

24 Claims, 7 Drawing Sheets

(56) References Cited

U.S. PATENT DOCUMENTS

| | | | | |
|---|---|---|---|---|
| 9,596,037 B2* | 3/2017 | Hsueh | ............... | H04B 17/345 |
| 11,543,851 B1* | 1/2023 | Lu | ............... | G06F 1/08 |
| 11,604,490 B1* | 3/2023 | Francis | ............... | H02M 3/155 |
| 11,853,112 B2* | 12/2023 | Lu | ............... | H03K 19/21 |
| 2004/0041547 A1* | 3/2004 | Asano | ............... | G06F 1/04 |
| | | | | 323/274 |
| 2006/0036980 A1* | 2/2006 | Kobayashi | ............... | G06F 30/367 |
| | | | | 716/113 |
| 2006/0267655 A1* | 11/2006 | Tokuyama | ............... | H04N 25/00 |
| | | | | 327/261 |
| 2007/0007970 A1* | 1/2007 | Neuman | ............... | G01R 31/31708 |
| | | | | 324/613 |
| 2009/0021310 A1* | 1/2009 | Tai | ............... | H03L 7/0998 |
| | | | | 331/2 |
| 2010/0039157 A1* | 2/2010 | Kaeriyama | ............... | H03K 5/133 |
| | | | | 327/292 |
| 2011/0193589 A1* | 8/2011 | Chua-Eoan | ............... | G01R 29/26 |
| | | | | 326/16 |
| 2012/0025880 A1* | 2/2012 | Romano | ............... | H03L 7/08 |
| | | | | 327/156 |
| 2013/0293281 A1* | 11/2013 | Baumann | ............... | G06F 1/305 |
| | | | | 327/365 |
| 2014/0091844 A1* | 4/2014 | Jakobsson | ............... | H03L 7/0805 |
| | | | | 327/158 |
| 2015/0035576 A1* | 2/2015 | Romano | ............... | H03K 5/135 |
| | | | | 327/262 |
| 2016/0013782 A1* | 1/2016 | Nakagawa | ............... | A61B 8/4494 |
| | | | | 327/276 |
| 2017/0163248 A1* | 6/2017 | Zyuban | ............... | G05F 1/46 |
| 2019/0028092 A1* | 1/2019 | Lu | ............... | H03K 5/1252 |
| 2019/0028209 A1 | 1/2019 | Lu et al. | | |
| 2020/0287527 A1* | 9/2020 | Kim | ............... | H03K 5/133 |
| 2022/0286121 A1* | 9/2022 | Fertsch | ............... | H03K 5/131 |
| 2022/0404858 A1* | 12/2022 | Lu | ............... | H03K 5/01 |
| 2023/0090529 A1* | 3/2023 | Lu | ............... | G06F 1/28 |
| | | | | 324/649 |
| 2023/0127752 A1* | 4/2023 | Francis | ............... | H03K 19/0016 |
| | | | | 326/33 |
| 2024/0085941 A1* | 3/2024 | Lu | ............... | G01R 27/02 |
| 2024/0223171 A1* | 7/2024 | Lee | ............... | H03K 5/1565 |
| 2025/0062754 A1* | 2/2025 | Mehdizad Taleie | ..... | H03K 5/01 |

OTHER PUBLICATIONS

Partial International Search Report—PCT/US2024/042176—ISA/EPO—Nov. 27, 2024.

* cited by examiner

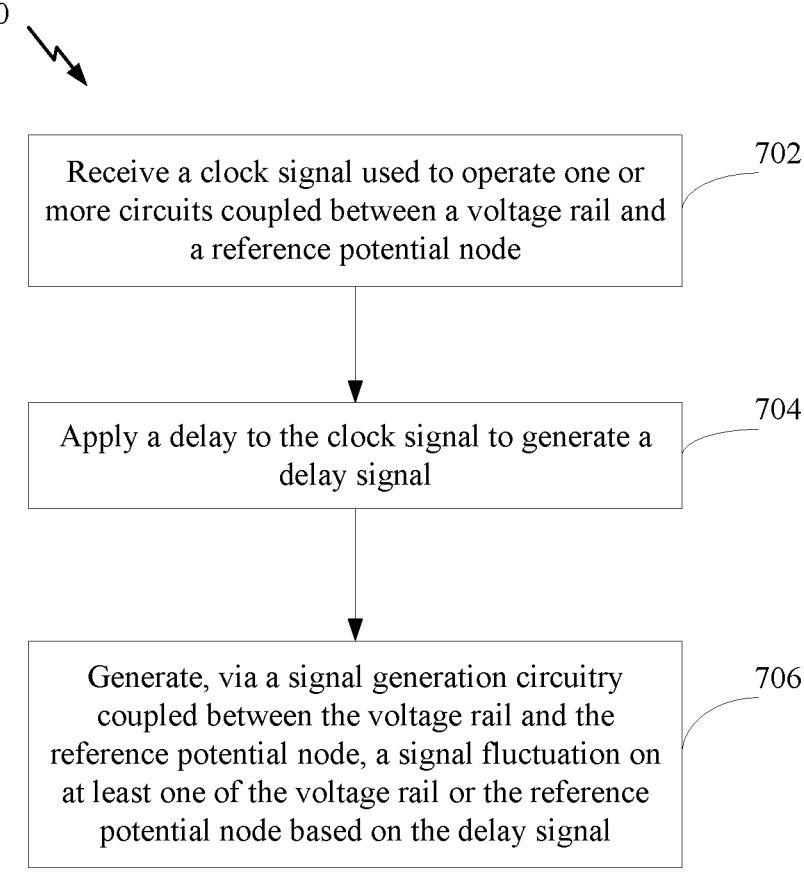

700

Receive a clock signal used to operate one or
more circuits coupled between a voltage rail and
a reference potential node

702

Apply a delay to the clock signal to generate a
delay signal

704

Generate, via a signal generation circuitry
coupled between the voltage rail and the
reference potential node, a signal fluctuation on
at least one of the voltage rail or the reference
potential node based on the delay signal

CLOCK SPUR REDUCTION VIA PHASE-CONTROLLED REPLICA PATH

TECHNICAL FIELD

Certain aspects of the present disclosure generally relate to electronic devices and, more particularly, to techniques and apparatus for attenuating spur power.

BACKGROUND

Various electronic circuits operate using a clock signal. The clock signal may be used to synchronize the operations of circuits in electronic systems. With increased operating speeds, the clock signal frequency has increased in newer generation devices. The rising and falling edges of the clock signal may cause noise at various nodes in the device, which may adversely impact the operations of other circuits.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure provide an apparatus for signal generation. The apparatus generally includes: one or more circuits coupled between a voltage rail and a reference potential node, wherein the one or more circuits are configured to operate using a clock signal; a delay signal generator configured to receive the clock signal and apply a delay to the clock signal to generate a delay signal; and signal generation circuitry coupled between the voltage rail and the reference potential node and configured to generate a signal fluctuation on at least one of the voltage rail or the reference potential node based on the delay signal.

Certain aspects of the present disclosure provide an apparatus for signal generation. The apparatus generally includes: one or more circuits coupled between a voltage rail and a reference potential node, wherein the one or more circuits are coupled to a clock input node; a control signal generator comprising a chain of delay elements coupled to the clock input node; and signal generation circuitry coupled between the voltage rail and the reference potential node and comprising a control input selectively coupled to one of the chain of delay elements, wherein the signal generation circuitry comprises at least one first capacitive element selectively couple to the voltage rail.

Certain aspects of the present disclosure provide a method for signal generation. The method generally includes: receiving a clock signal used to operate one or more circuits coupled between a voltage rail and a reference potential node; applying a delay to the clock signal to generate a delay signal; and generating, via signal generation circuitry coupled between the voltage rail and the reference potential node, a signal fluctuation on at least one of the voltage rail or the reference potential node based on the delay signal.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 7 is a flow diagram illustrating example operations for signal generation, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
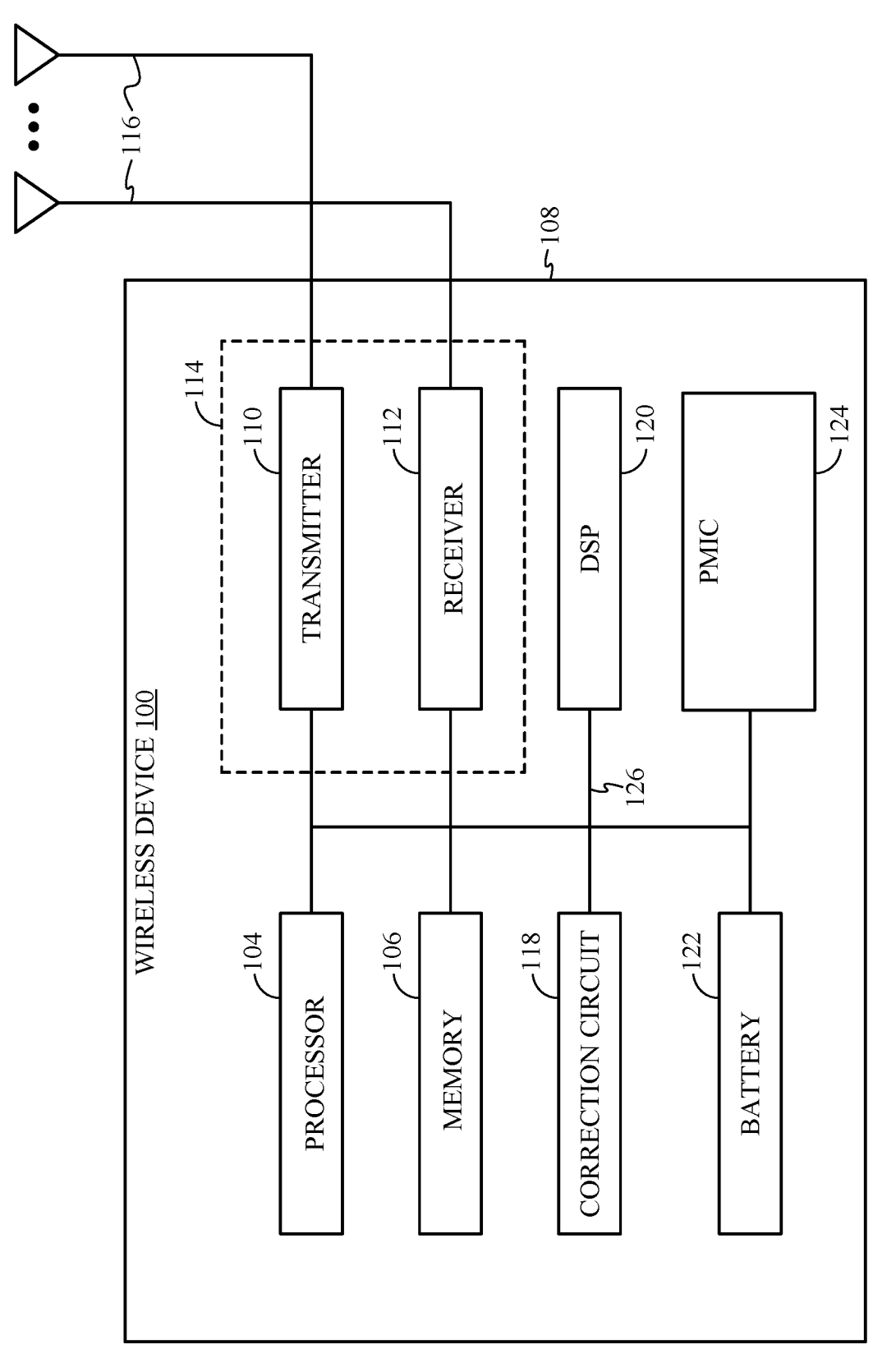
FIG. 1 is a block diagram of an example wireless device, in which aspects of the present disclosure may be practiced.

Certain aspects of the present disclosure provide techniques and apparatus for attenuating spur power generated by a clock signal. Certain aspects provide a correction circuit that generates replica clock spurs that are out-of-phase (e.g., by) 180° from clock spurs generated by the clock signal, thereby canceling out (or at least attenuating) the clock spurs. For example, the correction circuit may include a delay circuit that can apply a programmable delay to the clock signal to generate a delay signal. The delay signal may be used to generate the replica clock spurs and allows for the phase of the replica clock spurs to be programmable. The replica clock spurs may be generated by selectively coupling a capacitive element to a voltage rail, charging the capacitive element, and discharging the capacitive element to the reference potential node (e.g., ground node), as described in more detail herein.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Device

It should be understood that aspects of the present disclosure may be used in a variety of applications. Although the present disclosure is not limited in this respect, the circuits disclosed herein may be used in any of various suitable apparatus, such as in the power supply, battery charging circuit, or power management circuit of a communication system, a video codec, audio equipment such as music players and microphones, a television, camera equipment, and test equipment such as an oscilloscope. Communication systems intended to be included within the scope of the present disclosure include, by way of example only, cellular radiotelephone communication systems, satellite communication systems, two-way radio communication systems, one-way pagers, two-way pagers, personal communication systems (PCSs), personal digital assistants (PDAs), Internet of Things (IoT) devices, and the like.

FIG. 1 illustrates an example device 100 in which aspects of the present disclosure may be implemented. The device 100 may be a battery-operated device such as a cellular phone, a PDA, a handheld device, a wireless device, a laptop computer, a tablet, a smartphone, an IoT device, a wearable device, an augmented reality device, etc.

The device 100 may include a processor 104 that controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106.

In certain aspects, the device 100 may also include a transmitter 110 and/or a receiver 112 to allow transmission and/or reception, respectively, of data between the device 100 and a remote location. In some cases, the transmitter 110 and receiver 112 may be combined into a transceiver 114. One or more antennas 116 may be attached or otherwise coupled to a housing 108 of the device 100 and electrically coupled to the transceiver 114. For certain aspects, the device 100 may include multiple transmitters, multiple receivers, and/or multiple transceivers (not shown).

The device 100 may also include a correction circuit 118 that may be used to attenuate clock spur power, as described in more detail herein. The device 100 may also include a digital signal processor (DSP) 120 for use in processing digital signals.

The device 100 may further include a battery 122 used to power the various components of the device 100. The battery 122 illustrated in FIG. 1 may represent multiple portable power sources, such as a main battery and a backup battery (or a supercapacitor). In some cases, the battery 122 may be rechargeable.

The device 100 may also include a power management integrated circuit (PMIC) 124 (also referred to as a "power management unit (PMU)") for managing the power from the battery 122 to the various components of the device 100, for example. In addition to managing power distribution, the PMIC 124 may perform a variety of other functions for the device, such as DC-to-DC conversion, battery charging, power-source selection, voltage scaling, power sequencing, etc.

The various components of the device 100 may be coupled together by a bus system 126. The bus system 126 may include a power bus, a control signal bus (e.g., system power management interface (SPMI) or inter-integrated circuit (I2C) bus), and/or a status signal bus in addition to a data bus.

Example Techniques for Clock Spur Reduction

Harmonics of clock signals in mixed-signal, digital, and clock generation circuits create spurs on a supply node, a ground node, and on a substrate that would couple to sensitive parts of a system-on-chip (SOC). This issue is especially important in large-scale SOCs with multiple transmit and receive channels. Spur power on multiple channels experience different transfer functions, adding up and causing hard-to-filter spurs coupling to transmit or receive sensitive ports. This issue is particularly of interest in infrastructures that have stringent emission spur specifications. In some implementations, spurs at the transmit port may be lower than-80 dBm by design.

Figure 2:
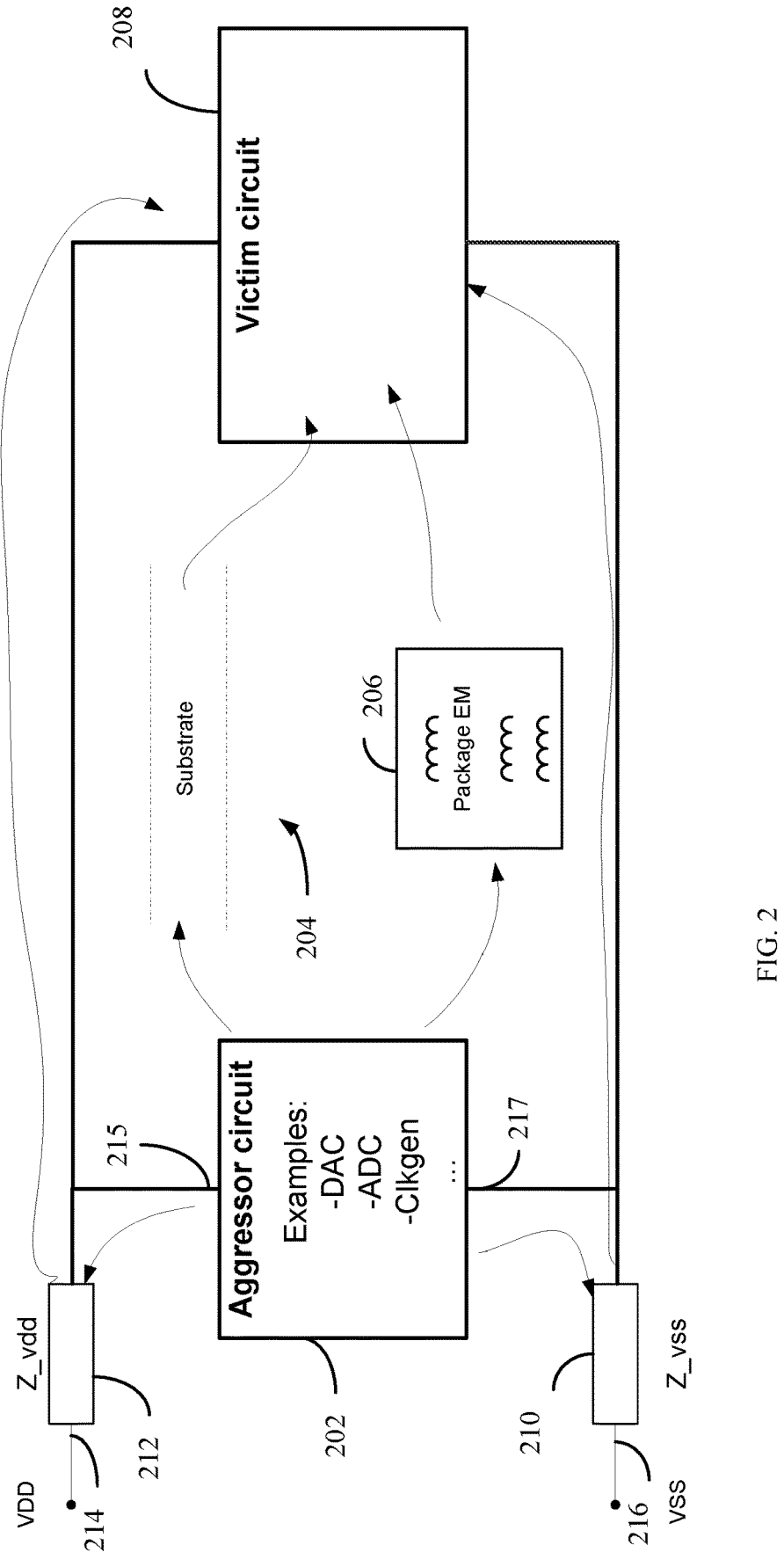
FIG. 2 illustrates an aggressor circuit coupling spur power to a victim circuit through various paths.

FIG. 2 illustrates an aggressor circuit 202 coupling spur power to a victim circuit 208 through various paths. As shown, the aggressor circuit 202 may be coupled to a supply node 214 receiving a supply voltage (VDD) and a reference potential node 216 (e.g., VSS, also referred to herein as a ground node). As shown, the supply node 214 may include a parasitic impedance 212 (e.g., labeled "Z_vdd"), and the reference potential node 216 may include a parasitic impedance 210 (e.g., labeled "Z_vss"). The parasitic impedance 212 may exist between a supply port 215 (e.g., supply port) of the aggressor circuit 202 and the supply node 214, and the parasitic impedance 210 may exist between the reference potential port 217 (e.g., ground port) of the aggressor circuit 202 and the reference potential node 216.

Spur power from the aggressor circuit 202 may be coupled through the supply node 215, the reference potential node 217, a substrate 204, or package electromagnetic (EM) elements 206 (e.g., inductive elements) to a victim circuit 208. The aggressor circuit 202 may be circuitry such as a digital-to-analog converter (DAC), analog-to-digital converter (ADC), or any clock generation circuit. The victim circuit 208 may be a node of a transmitter or receiver in the baseband (BB) domain, intermediate frequency (IF) domain, or a radio frequency (RF) domain.

Typical isolation schemes (e.g., separation of package bumps or balls, separation of package routing, usage of a high-resistive substrate, or usage of guard rings) may be insufficient to meet specifications associated with clock spur emissions. Typical clock spur mitigation schemes involve complex frequency planning to reduce spurs or adjust output power levels that may make system design difficult and/or compromise performance. A finite amount of clock harmonics usually couples to sensitive nets, degrading performance. The clock harmonic spurs may cause hard-to-debug, costly, and difficult-to-fix emissions violations. The specific spur which is challenging to protect against is clock harmonics. Different mixed-signal or digital circuits have clock trees that create integer multiples of a clock frequency up to high harmonics.

Figure 3:
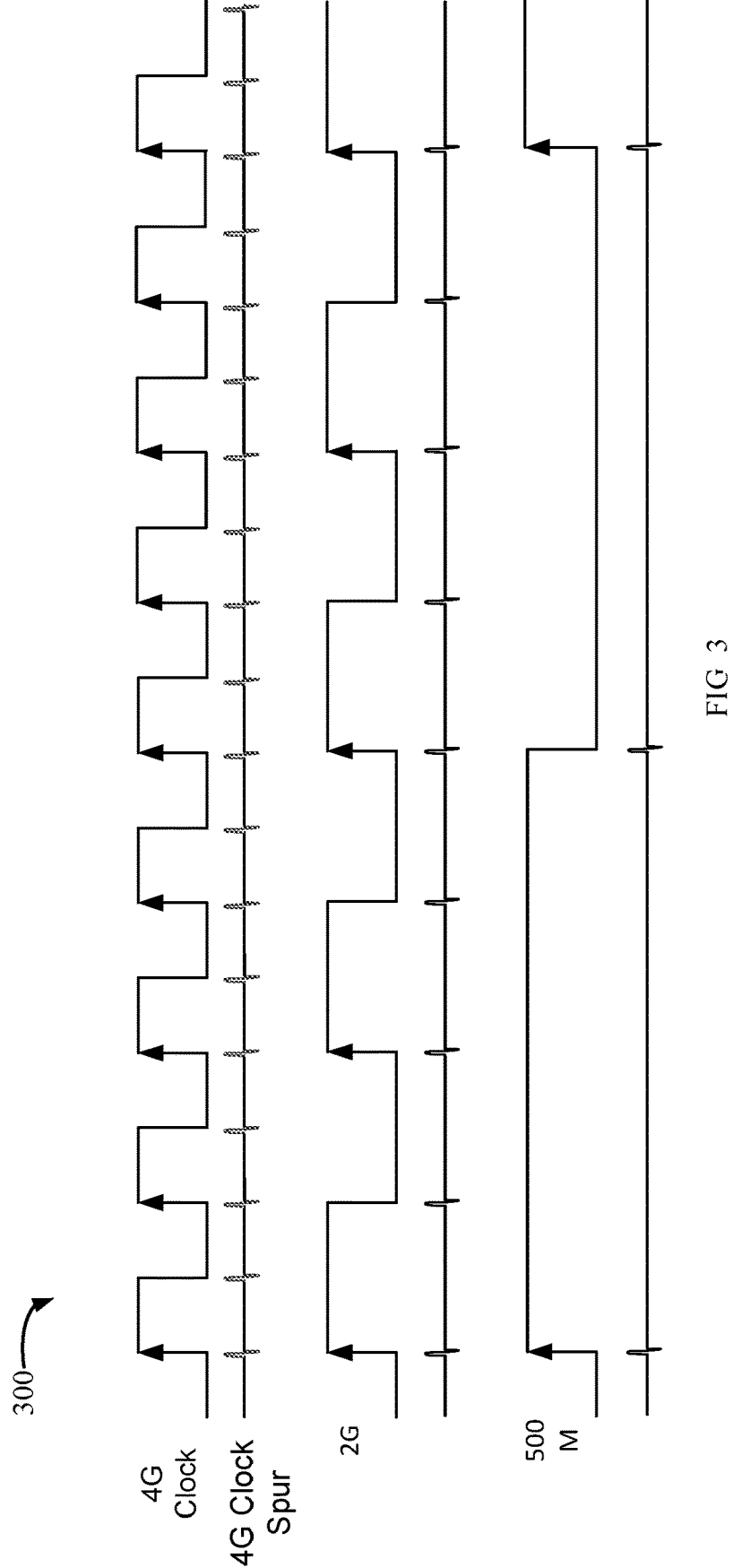
FIG. 3 illustrates clock signals and associated spurs.

FIG. 3 is an example graph 300 illustrating a four gigahertz (4 G) clock, a two gigahertz (2 G) clock, and a 500 megahertz (500 M) clock and associated clock spurs. As shown, spurs are generated on a supply node or reference potential node at a frequency that is twice the clock frequency (Folk) (e.g., due to the rising and falling clock edges during each clock cycle). Harmonics of the clock signal are generated at n x Fclk, n being any integer greater than two.

Figure 4:
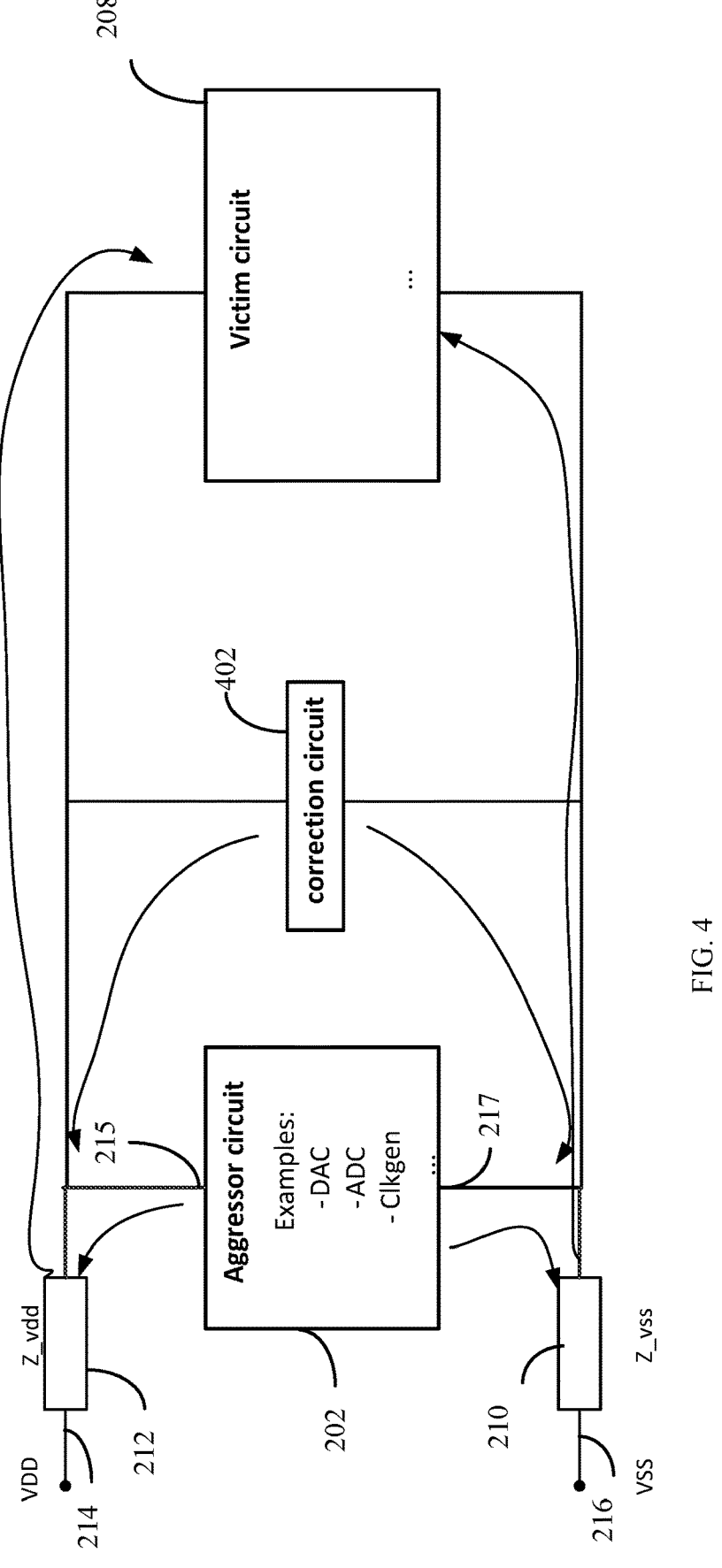
FIG. 4 illustrates a correction circuit configured to attenuate a clock spur and/or a clock spur harmonic, in accordance with certain aspects of the present disclosure.

FIG. 4 illustrates a correction circuit 402 configured to attenuate a clock spur, in accordance with certain aspects of the present disclosure. The correction circuit 402 may attenuate the clock spur at a source of the clock spur (e.g., at supply port 215 and reference potential port 217 of the aggressor circuit 202 coupled to the supply node 214 and reference potential node 216, respectively). The correction circuit 402 generates replica spurs via a parallel path open loop clock chain, as described in more detail herein. The replica spurs may have an opposite phase as the clock spurs, thereby attenuating the clock spurs.

Figure 5:
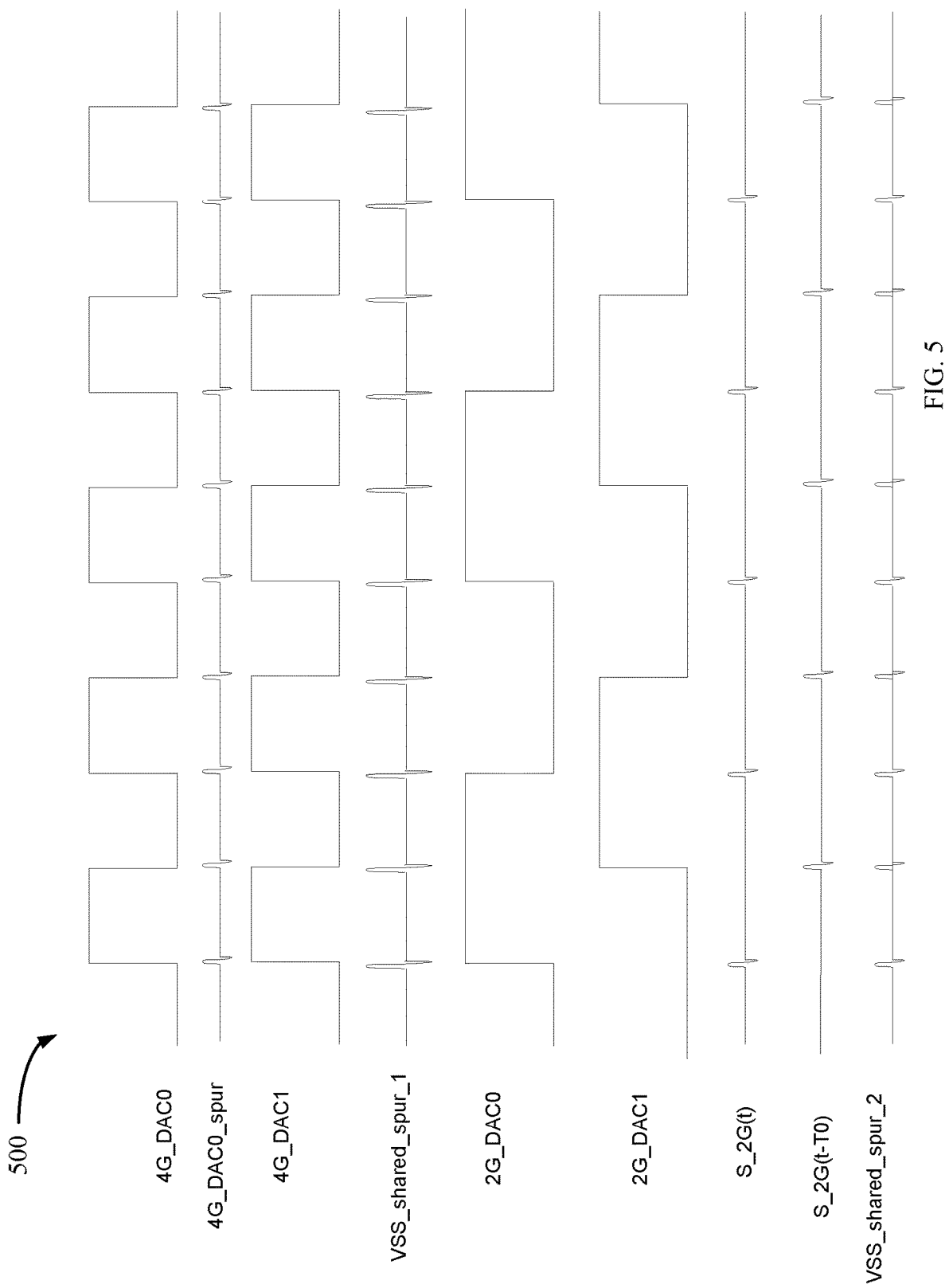
FIG. 5 illustrates clock signals and associated spurs on shared nodes.

FIG. 5 is an example graph 500 illustrating clock signals and associated spurs. As shown, a first DAC (DAC0) and a second DAC (DAC1) may operate on 4 G clocks (e.g., labeled "4 G_DAC0" and "4 G_DAC1"). The 4 G clocks may each generate clock spurs. For example, the 4 G clock for DAC0 may generate clock spurs labeled "4 G_DAC0_spur." DAC0 and DAC1 may have a shared reference potential node (VSS). Thus, clock spurs (e.g., labeled "VSS_shared_spur_1") may be generated on the shared VSS. As shown, due to the combined effect of the clocks from DAC0 and DAC1, the magnitudes of the clock spurs on the shared VSS are increased (e.g., are greater than the 4 G_DAC0_spur).

As shown, in some cases, DAC0 and DAC1 may use 2 G clocks (labeled "2 G_DAC0" and "2 G_DAC1"). The 2 G clocks are offset by a period TO. The 2 G clocks generate clock spurs labeled "S_2 G (t)" and "S_2 G (t-T0)," as shown. As described, the DACs may generate clock spurs (labeled "VSS_shared_spur_2") on a shared VSS, as shown. In the time domain, clock spurs may be generated based on the expression:

$$\sum_{n=-\infty}^{n=+\infty} \sigma\left(t - \frac{n}{2Fs}\right)$$

where n is a positive integer, Fs is the frequency of the clock signal, and σ is the spur function. In the frequency domain, the spurs are generated based on the expression:

$$e^{-(j\omega\Delta T0)}$$

6 where ω is the angular frequency associated with the clock signals and ΔT0 is the time offset between the clock signals, as described.

Figure 6:
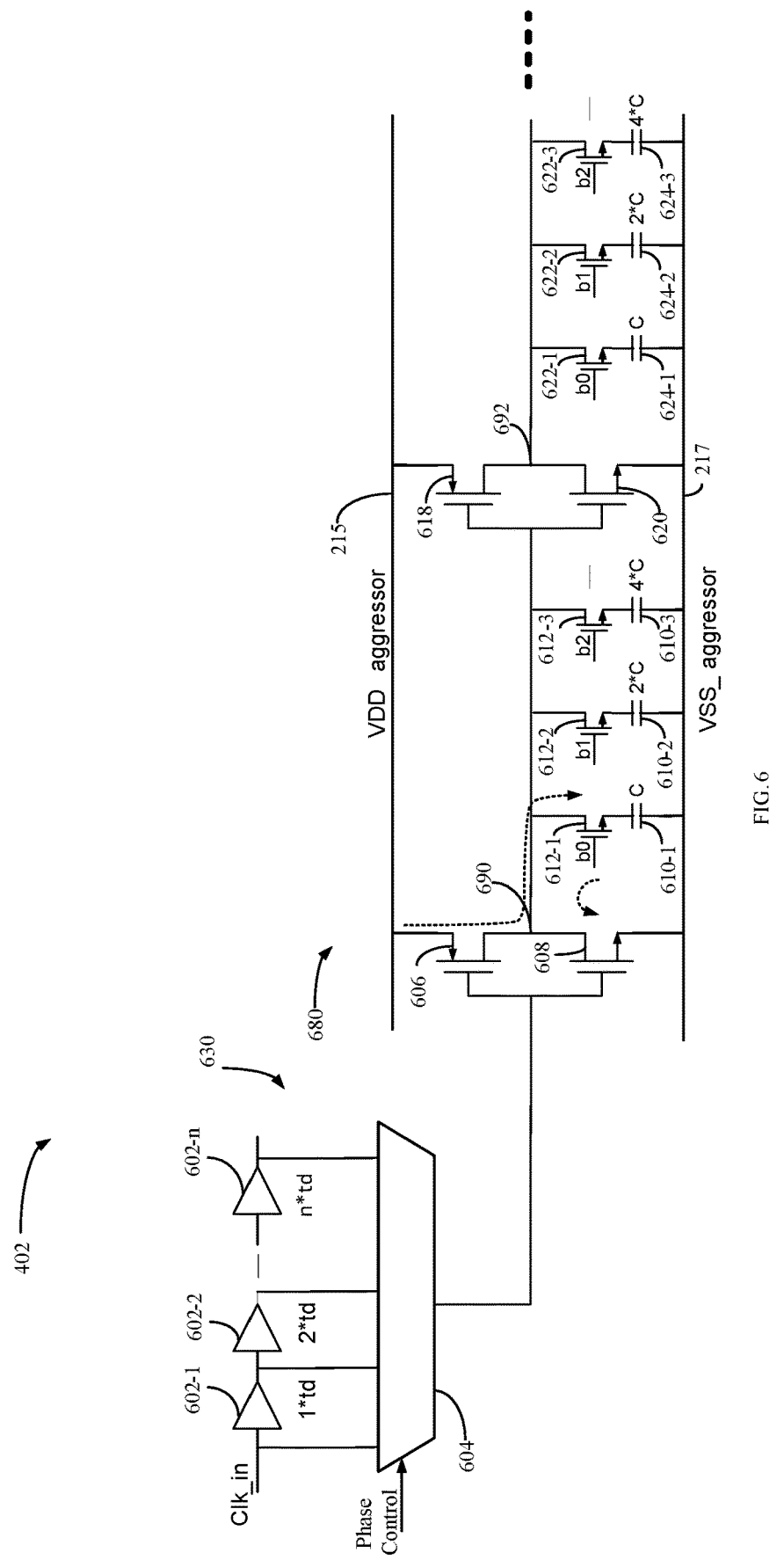
FIG. 6 illustrates an example implementation of a correction circuit, in accordance with certain aspects of the present disclosure.

FIG. 6 illustrates an example implementation of the correction circuit 402, in accordance with certain aspects of the present disclosure. As shown, the correction circuit 402 includes a programmable delay circuit 630 to adjust the phase of the spur to be attenuated. The programmable delay circuit 630 may include delay elements 602-1, 602-2, to 602-n (collectively referred to as "delay elements 602"), n being an integer greater than 1. An input clock (Clk_in) signal may be provided to an input of delay element 602-1, where the delay elements are daisy chained (e.g., the output of delay element 602-1 is coupled to an input of delay element 602-2, and so on).

The Clk_in node and the outputs of each of the delay elements 602 may be coupled to inputs of a multiplexer 604. As shown, each of the delay elements 602 may apply a delay td. Thus, the output signal of delay element 602-1 may be the Clk_in signal delayed by td, the output signal of delay element 602-2 may be the Clk_in signal delayed by 2 td, and so on. In some aspects, the programmable delay circuit 630 may be implemented with low load current from the Clk_in node (e.g., since the input to the multiplexer 604 and delay element 602-1 is high impedance).

During a calibration phase, the delay associated with the programmable delay circuit 630 may be selected to reduce the spur at a harmonic frequency of the clock signal. For example, during calibration, a particular phase may be selected that attenuates the spur at the second harmonic of the clock signal.

The output of the multiplexer 604 may be coupled to signal generation circuitry 680. For example, output of the multiplexer 604 may be coupled to the gates of a p-channel metal-oxide semiconductor (PMOS) transistor 606 and an n-channel metal-oxide semiconductor (NMOS) transistor 608. The transistors 606, 608 form a complementary metal-oxide-semiconductor (CMOS) inverter. Based on a phase control signal (labeled "Phase Control"), the multiplexer may provide the Clk_in signal or an output signal of one of the delay elements 602 to the gates of transistors 606, 608. The source of transistor 606 may be coupled to the supply node 215 (e.g., the supply node of the aggressor circuit 202), labeled "VDD_aggressor," as shown. The source of transistor 608 may be coupled to a reference potential node 217 (e.g., the reference potential node of the aggressor circuit 202), labeled "VSS_aggressor," as shown.

The drains of transistors 606, 608 at node 690 are selectively coupled to capacitive elements 610-1, 610-2, 610-3 (collectively referred to as capacitive elements 610) via respective switches 612-1, 612-2, 612-3 (collectively referred to as "switches 612"). The capacitive elements 610-1, 610-2, 610-3 have capacitance C, 2C, and 3C, respectively, where C is a unit of capacitance. While three capacitive elements 610-1, 610-2, 610-3 and associated switches 612-1, 612-2, 612-3 are shown, any number of capacitive elements and associated switches may be used. By closing one or more of the switches 612, one or more respective capacitive elements 610 may be coupled between drains of the transistors 606, 608 and the reference potential node 217, setting a magnitude of the replica clock spur generated by the correction circuit 402. For example, when the output of multiplexer 604 is logic high, transistor 606 is turned on, and transistor 608 is turned off, sinking current from the supply node 215 to charge one or more of the capacitive elements 610 and generating a clock spur on the supply node 215. When the output of the multiplexer 604 is logic low, transistor 608 is turned on, and transistor 606 is turned off, discharging the one or more of the capacitive elements 610 to the reference potential node 217 and generating a clock spur on the reference potential node 216. The magnitude of the generated clock spurs is based on the total capacitance of the one or more of the capacitive elements 610 selectively coupled to drains of transistors 606, 608.

The correction circuit 402 provides a programmable delay replica clock path that generates clock spurs that are frequency locked to the aggressor circuit clock but at a given or programmable delay to create out-of-phase clock spurs and cancel (or at least attenuate) the net clock spur from the aggressor circuit at sensitive ports (e.g., the supply node and reference potential nodes of the aggressor circuit). The programmable delay circuit 630 provides an open-loop delay chain. The control signal to the multiplexer 604 may be used to select a phase of the clock signal to be used for generating the replica clock spurs.

As shown, the drains of the transistors 606, 608 (e.g., output of inverter formed by transistors 606, 608) may be coupled to gates of transistors 618, 620 forming another CMOS inverter. As shown, capacitive elements 624-1, 624-2, and 624-3 (e.g., collectively referred to as "capacitive elements 624") may be selectively coupled to drains of transistors 618, 620 at node 692 via respective switches 622-1, 622-2, and 622-3.

When one or more of the capacitive elements 610 are being charged via current from the supply node 215, one or more of the capacitive elements 624 are being discharged to the reference potential node. Similarly, when one or more of the capacitive elements 610 are being discharged, one or more of the capacitive elements 624 are being charged. Thus, during each rising or falling edge of the delay signal at the output of the multiplexer 604, a replica clock spur is generated on the supply node and the reference potential node.

The correction circuit allows for attenuating the power of spurs based on an emissions signature (e.g., as measured by a spectrum analyzer), allowing for 10 to 15 dB of attenuation of spur level, in some cases. The attenuation of clock spurs in a transceiver reduces constraints on output power and offers frequency planning flexibility.

FIG. 7 is a flow diagram illustrating example operations 700 for signal generation, in accordance with certain aspects of the present disclosure. The operations 700 may be performed by a correction circuit, such as the correction circuit 402.

At block 702, the correction circuit receives a clock signal used to operate one or more circuits (e.g., aggressor circuit 202) (having power supply inputs or ports) coupled between a voltage rail (e.g., supply port 215) and a reference potential node (e.g., reference potential port 217).

At block 704, the correction circuit may apply a delay to the clock signal to generate a delay signal. At block 706, the correction circuit may generate (e.g., via signal generation circuitry 680 coupled between the voltage rail and the reference potential node) a signal fluctuation on at least one of the voltage rail or the reference potential node based on the delay signal. The signal fluctuation may be 180° out-of-phase with a spur generated on the voltage rail by the clock signal.

In some aspects, the delay signal is one of a plurality of delay signals generated via a chain of delay elements (e.g., delay elements 602). The correction circuit may select (e.g., via multiplexer 604), as the delay signal, one of the plurality of delay signals to provide to the signal generation circuitry.

In some aspects, generating the signal fluctuation may include selectively coupling at least one first capacitive element (e.g., at least one of capacitive elements 610) between the voltage rail and the reference potential node based on the delay signal to charge the at least one first capacitive element. In some aspects, generating the signal fluctuation may include discharging the at least one first capacitive element based on the delay signal.

Example Aspects

In addition to the various aspects described above, specific combinations of aspects are within the scope of the disclosure, some of which are detailed below:

Aspect 1: An apparatus for signal generation, comprising: one or more circuits coupled between a voltage rail and a reference potential node, wherein the one or more circuits are configured to operate using a clock signal; a delay signal generator configured to: receive the clock signal; and apply a delay to the clock signal to generate a delay signal; and signal generation circuitry coupled between the voltage rail and the reference potential node and configured to generate a signal fluctuation on at least one of the voltage rail or the reference potential node based on the delay signal.

Aspect 2: The apparatus of Aspect 1, wherein the signal fluctuation is 180° out-of-phase with a spur generated on the voltage rail or the reference potential node by the clock signal.

Aspect 3: The apparatus of Aspect 1 or 2, wherein the delay signal generator comprises: a chain of delay elements, one of the delay elements being configured to receive the clock signal; and a multiplexer having inputs coupled to outputs of the delay elements, wherein an output of the multiplexer is coupled to an input of the signal generation circuitry.

Aspect 4: The apparatus according to any of Aspects 1-3, wherein the signal generation circuitry comprises: at least one first capacitive element; and a first switch coupled to the at least one first capacitive element, the first switch being configured to selectively couple the at least one first capacitive element to the voltage rail based on the delay signal.

Aspect 5: The apparatus of Aspect 4, wherein the signal generation circuitry further comprises a second switch coupled to the at least one first capacitive element, the second switch being configured to discharge the at least one first capacitive element based on the delay signal.

Aspect 6: The apparatus of Aspect 5, wherein the at least one first capacitive element comprises multiple capacitive elements, each of the multiple capacitive elements being selectively coupled to the first switch and the second switch via a third switch.

Aspect 7: The apparatus of Aspect 6, wherein each of the multiple capacitive elements is selectively coupled to a node between the first switch and the second switch via the third switch.

Aspect 8: The apparatus according to any of Aspects 5-7, wherein the first switch and the second switch form an inverter.

Aspect 9: The apparatus according to any of Aspects 5-8, wherein the signal generation circuitry further comprises: at least one second capacitive element; and a third switch coupled to the at least one second capacitive element, the third switch being configured to selectively couple the at least one second capacitive element to the voltage rail based on an output signal of an inverter formed by the first switch and the second switch.

Aspect 10: The apparatus of Aspect 9, wherein the signal generation circuitry further comprises a fourth switch coupled to the at least one second capacitive element, the fourth switch being configured to discharge the at least one second capacitive element based on the output signal of the inverter.

Aspect 11: An apparatus for signal generation, comprising: one or more circuits coupled between a voltage rail and a reference potential node, wherein the one or more circuits are coupled to a clock input node; a delay signal generator comprising a chain of delay elements coupled to the clock input node; and signal generation circuitry coupled between the voltage rail and the reference potential node and comprising a control input selectively coupled to one of the chain of delay elements, wherein the signal generation circuitry comprises at least one first capacitive element selectively coupled to the voltage rail.

Aspect 12: The apparatus of Aspect 11, wherein the signal generation circuitry is configured to generate a signal fluctuation on at least one of the voltage rail or the reference potential node based on a signal at the control input of the signal generation circuitry.

Aspect 13: The apparatus of Aspect 12, wherein the signal fluctuation is 180° out-of-phase with a spur generated by a clock signal at the clock input node.

Aspect 14: The apparatus according to any of Aspects 11-13, wherein the delay signal generator further comprises a multiplexer having inputs coupled to the chain of delay elements, wherein an output of the multiplexer is coupled to the control input of the signal generation circuitry.

Aspect 15: The apparatus according to any of Aspects 11-14, wherein the signal generation circuitry further comprises a first switch coupled between the voltage rail and the at least one first capacitive element, the control input of the signal generation circuitry being coupled to a control input of the first switch.

Aspect 16: The apparatus of Aspect 15, wherein the first switch is configured to selectively couple the at least one first capacitive element to the voltage rail.

Aspect 17: The apparatus of Aspect 15 or 16, wherein the signal generation circuitry further comprises a second switch coupled between the reference potential node and the at least one first capacitive element, the control input of the signal generation circuitry being further coupled to the control input of the second switch.

Aspect 18: The apparatus of Aspect 17, wherein the second switch is configured to discharge the at least one first capacitive element.

Aspect 19: The apparatus of Aspect 17 or 18, wherein: the at least one first capacitive element comprises multiple capacitive elements; and the apparatus further comprises a third switch coupled between each of the multiple capacitive elements and a node between the first switch and the second switch via the third switch.

Aspect 20: The apparatus according to any of Aspects 17-19, wherein the first switch and the second switch form an inverter.

Aspect 21: The apparatus according to any of Aspects 17-20, wherein the signal generation circuitry further comprises: at least one second capacitive element; and a third switch selectively coupled to the at least one second capacitive element and having a control input coupled to an output of an inverter formed by the first switch and the second switch.

Aspect 22: A method for signal generation, comprising: receiving a clock signal used to operate one or more circuits coupled between a voltage rail and a reference potential node; applying a delay to the clock signal to generate a delay signal; and generating, via signal generation circuitry coupled between the voltage rail and the reference potential node, a signal fluctuation on at least one of the voltage rail or the reference potential node based on the delay signal.

Aspect 23: The method of Aspect 22, wherein the signal fluctuation is 180° out-of-phase with a spur generated on the voltage rail by the clock signal.

Aspect 24: The method of Aspect 23, wherein: the delay signal is one of a plurality of delay signals generated via a chain of delay elements; and selecting, as the delay signal, one of the plurality of delay signals to provide to the signal generation circuitry.

Aspect 25: The method of Aspect 23 or 24, wherein generating the signal fluctuation comprises selectively coupling at least one first capacitive element to the voltage rail based on the delay signal to charge the at least one first capacitive element.

Aspect 26: The method of Aspect 25, wherein generating the signal fluctuation further comprises discharging the at least one first capacitive element based on the delay signal.

Additional Considerations

The various operations of methods described above may be performed by any suitable means capable of performing the corresponding functions. The means may include various hardware and/or software component(s) and/or module(s), including, but not limited to a circuit, an application-specific integrated circuit (ASIC), or a processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. An apparatus for signal generation, comprising:
   one or more circuits coupled between a voltage rail and a reference potential node, wherein the one or more circuits are configured to operate using a clock signal;

a delay signal generator configured to:
  receive the clock signal; and
  apply a delay to the clock signal to generate a delay
    signal; and
signal generation circuitry coupled between the voltage
  rail and the reference potential node and configured to
  generate a signal fluctuation on at least one of the
  voltage rail or the reference potential node based on the
  delay signal, the signal generation circuitry including at
  least one first capacitive element, and a first switch
  coupled to the at least one first capacitive element, the
  first switch being configured to selectively couple the at
  least one first capacitive element to the voltage rail
  based on the delay signal, wherein the delay is selected
  to attenuate a spur at a harmonic frequency of the clock
  signal on the voltage rail or the reference potential
  node.

2. The apparatus of claim 1, wherein the signal fluctuation
is 180° out-of-phase with the spur generated on the voltage
rail or the reference potential node by the clock signal.

3. The apparatus of claim 1, wherein the delay signal
generator comprises:
  a chain of delay elements, one of the delay elements being
    configured to receive the clock signal; and
  a multiplexer having inputs coupled to outputs of the
    delay elements, wherein an output of the multiplexer is
    coupled to an input of the signal generation circuitry.

4. The apparatus of claim 1, wherein the signal generation
circuitry further comprises a second switch coupled to the at
least one first capacitive element, the second switch being
configured to discharge the at least one first capacitive
element based on the delay signal.

5. The apparatus of claim 4, wherein the at least one first
capacitive element comprises multiple capacitive elements,
each of the multiple capacitive elements being selectively
coupled to the first switch and the second switch via a third
switch, the first switch and the second switch forming an
inverter.

6. The apparatus of claim 5, wherein each of the multiple
capacitive elements is selectively coupled to a node between
the first switch and the second switch via the third switch.

7. The apparatus of claim 4, wherein the first switch and
the second switch form an inverter.

8. The apparatus of claim 4, wherein the signal generation
circuitry further comprises:
  at least one second capacitive element; and
  a third switch coupled to the at least one second capacitive
    element, the third switch being configured to selec-
    tively couple the at least one second capacitive element
    to the voltage rail based on an output signal of an
    inverter formed by the first switch and the second
    switch.

9. The apparatus of claim 8, wherein the signal generation
circuitry further comprises a fourth switch coupled to the at
least one second capacitive element, the fourth switch being
configured to discharge the at least one second capacitive
element based on the output signal of the inverter.

10. An apparatus for signal generation, comprising:
  one or more circuits coupled between a voltage rail and a
    reference potential node, wherein the one or more
    circuits are coupled to a clock input node;
  a delay signal generator comprising a chain of delay
    elements coupled to the clock input node; and
  signal generation circuitry coupled between the voltage
    rail and the reference potential node and comprising a
    control input selectively coupled to one of the chain of
    delay elements, wherein the signal generation circuitry comprises at least one first capacitive element selec-
tively coupled to the voltage rail, wherein a delay
associated with the delay signal generator is selected to
attenuate a spur at a harmonic frequency of a clock
signal on the voltage rail or the reference potential
node.

11. The apparatus of claim 10, wherein the signal gen-
eration circuitry is configured to generate a signal fluctuation
on at least one of the voltage rail or the reference potential
node based on a signal at the control input of the signal
generation circuitry.

12. The apparatus of claim 11, wherein the signal fluc-
tuation is 180° out-of-phase with the spur generated by the
clock signal at the clock input node.

13. The apparatus of claim 10, wherein the delay signal
generator further comprises a multiplexer having inputs
coupled to the chain of delay elements, wherein an output of
the multiplexer is coupled to the control input of the signal
generation circuitry.

14. The apparatus of claim 10, wherein the signal gen-
eration circuitry further comprises a first switch coupled
between the voltage rail and the at least one first capacitive
element, the control input of the signal generation circuitry
being coupled to a control input of the first switch.

15. The apparatus of claim 14, wherein the first switch is
configured to selectively couple the at least one first capaci-
tive element to the voltage rail.

16. The apparatus of claim 14, wherein the signal gen-
eration circuitry further comprises a second switch coupled
between the reference potential node and the at least one first
capacitive element, the control input of the signal generation
circuitry being further coupled to the control input of the
second switch.

17. The apparatus of claim 16, wherein the second switch
is configured to discharge the at least one first capacitive
element.

18. The apparatus of claim 16, wherein:
  the at least one first capacitive element comprises multiple
    capacitive elements; and
  the signal generation circuitry further comprises a third
    switch coupled between each of the multiple capacitive
    elements and a node between the first switch and the
    second switch via the third switch, the first switch and
    the second switch forming an inverter.

19. The apparatus of claim 16, wherein the first switch and
the second switch form an inverter.

20. The apparatus of claim 16, wherein the signal gen-
eration circuitry further comprises:
  at least one second capacitive element; and
  a third switch selectively coupled to the at least one
    second capacitive element and having a control input
    coupled to an output of an inverter formed by the first
    switch and the second switch.

21. A method for signal generation, comprising:
  receiving a clock signal used to operate one or more
    circuits coupled between a voltage rail and a reference
    potential node;
  applying a delay to the clock signal to generate a delay
    signal; and
  generating, via signal generation circuitry coupled
    between the voltage rail and the reference potential
    node, a signal fluctuation on at least one of the voltage
    rail or the reference potential node based on the delay
    signal, wherein generating the signal fluctuation com-
    prises selectively coupling at least one first capacitive
    element to the voltage rail based on the delay signal to
    charge the at least one first capacitive element, wherein the delay is selected to attenuate a spur at a harmonic
frequency of the clock signal on the voltage rail or the
reference potential node.

22. The method of claim 21, wherein the signal fluctuation
is 180° out-of-phase with the spur generated on the voltage
rail by the clock signal.

23. The method of claim 22, wherein:

the delay signal is one of a plurality of delay signals
generated via a chain of delay elements; and selecting, as the delay signal, one of the plurality of delay
signals to provide to the signal generation circuitry.

24. The method of claim 21, wherein generating the signal
fluctuation further comprises discharging the at least one
first capacitive element based on the delay signal.

\* \* \* \* \*